United States Patent
Hammerschmidt

(10) Patent No.: US 8,044,676 B2
(45) Date of Patent: Oct. 25, 2011

(54) IDDQ TESTING

(75) Inventor: Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 20 days.

(21) Appl. No.: 12/136,782

(22) Filed: Jun. 11, 2008

(65) Prior Publication Data

US 2009/0309621 A1    Dec. 17, 2009

(51) Int. Cl.
*G01R 31/00*   (2006.01)
*G01R 31/02*   (2006.01)
*G01R 31/26*   (2006.01)

(52) U.S. Cl. .............. 324/762.01; 324/750.03

(58) Field of Classification Search ............ None
See application file for complete search history.

(56) References Cited

U.S. PATENT DOCUMENTS

| | | | |
|---|---|---|---|
| 5,554,941 A | 9/1996 | Kesel | |
| 5,592,493 A * | 1/1997 | Crouch et al. | 714/729 |
| 5,757,816 A | 5/1998 | Al-Assadi et al. | |
| 6,035,421 A * | 3/2000 | Henno et al. | 714/30 |
| 6,127,838 A | 10/2000 | Sachdev | |
| 6,820,220 B1 * | 11/2004 | Dominke et al. | 714/30 |
| 6,842,032 B2 * | 1/2005 | Palusa | 324/765 |
| 6,930,500 B2 | 8/2005 | Srivastava | |
| 6,934,652 B2 * | 8/2005 | Gauthier et al. | 702/99 |
| 7,265,570 B2 * | 9/2007 | Ong | 324/765 |
| 7,272,767 B2 | 9/2007 | Colunga et al. | |
| 2003/0123309 A1 * | 7/2003 | Kanetani et al. | 365/201 |
| 2004/0021460 A1 * | 2/2004 | Ohtsuki | 324/207.26 |
| 2006/0250152 A1 * | 11/2006 | Vazquez et al. | 324/765 |

FOREIGN PATENT DOCUMENTS

WO    2004063979 A1    7/2004

* cited by examiner

*Primary Examiner* — Roberto Velez
(74) *Attorney, Agent, or Firm* — Patterson Thuente Christensen Pedersen, P.A.

(57) ABSTRACT

Embodiments of the invention relate to device-embedded IDDQ testing in the field to detect defects, aging, and other reliability reducing problems. Methods of testing integrated circuits and integrated circuit devices are disclosed. For example, an integrated circuit device can comprise an integrated circuit, a buffer capacitor coupled to the integrated circuit; and IDDQ test circuitry coupled to the buffer capacitor and configured to suspend normal operation of the integrated circuit and measure a discharge time of the buffer capacitor, wherein the discharge time is related to a leakage current of the integrated circuit.

9 Claims, 3 Drawing Sheets

IDDQ TESTING

BACKGROUND

IDDQ testing is a method for testing CMOS integrated circuits (ICs) for manufacturing defects. In IDDQ testing, the supply current, Idd, of the IC is measured in a quiescent state, hence the acronym IDDQ for Idd (quiescent). It is commonly used in end-of-line testing during manufacturing, as depicted in FIG. 1, such that devices that have been overstressed in manufacturing or have other defects can be identified before implementation and reduced reliability or failure in use.

ICs are typically part of larger devices, and these devices can be subjected to harsh and damaging conditions during normal use. For example, IC sensor devices are often mounted in automobiles in positions in which they are exposed to high temperatures, mechanical stresses, and/or high electrostatic discharge (ESD) or electromagnetic compatibility (EMC) risks. These devices, however, still must be accurate and reliable over an expected operating lifetime of ten years or more. If consistently stressed, IC sensor devices may experience an unknown reduced operating lifetime or performance even if they do not immediately fail.

SUMMARY

One embodiment is a method of testing an integrated circuit having an in-field implementation. An IDDQ test circuit is formed, the IDDQ test circuit is coupled to a testable portion of the integrated circuit, and the IDDQ test circuit is scheduled to test the testable portion of the integrated circuit in an in-field implementation.

Another embodiment is a method of testing an integrated circuit. In-field operation of an integrated circuit device is suspended. An IDDQ test routine is performed on at least a portion of the integrated circuit device. A notification of a result of the IDDQ test routine is provided.

Yet another embodiment is an integrated circuit device. The integrated circuit device comprises an integrated circuit, a buffer capacitor coupled to the integrated circuit; and IDDQ test circuitry coupled to the buffer capacitor and configured to suspend normal operation of the integrated circuit and measure a discharge time of the buffer capacitor, wherein the discharge time is related to a leakage current of the integrated circuit.

BRIEF DESCRIPTION OF THE DRAWINGS

The invention may be more completely understood from the following detailed description of various embodiments in connection with the accompanying drawings, in which.

Figure 1:
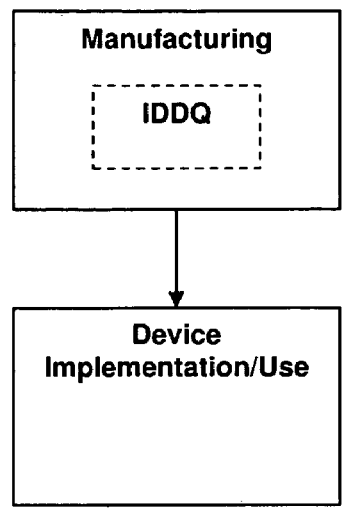
FIG. 1 is a block diagram according to one embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments of the invention relate to device-embedded IDDQ testing in the field to detect defects, aging, and other reliability reducing problems. Various embodiments of the invention can be more readily understood by reference to FIGS. 1-4 and the following description. While the invention is not necessarily limited to the specifically depicted application(s), the invention will be better appreciated using a discussion of exemplary embodiments in specific contexts.

Figure 2:
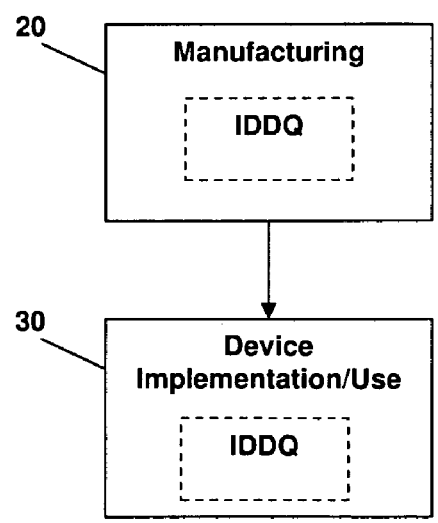
FIG. 2 is a block diagram according to one embodiment.

Embodiments of the invention comprise IDDQ test circuitry embedded in ICs and IC devices and IDDQ test methodologies that can detect possible reliability defects in devices. Referring to FIG. 2, IDDQ testing can be implemented during manufacturing, as shown at 20, but is also available during the life of the device in normal implementation and use at 30, according to various embodiments of the invention.

In one embodiment, IDDQ testing can be made available in a test state of a device, and the test state can be selectively activated during normal operation of the device in the field. This IDDQ test state can be activated whenever normal operation of the device may be briefly interrupted, such as in a startup sequence, during idle states of a control state machine, controlled by a software command, initiated by an IDDQ test message via an interface or bus, and in other states and manners.

In one embodiment, the IDDQ testable parts of the IC are disconnected from the power supply and discharge a supply buffer capacitor to a level that is below the normal supply but high enough to keep the actual state in registers and/or memories. The time for this discharge process is measured by an independent IDDQ counter. After reaching the discharge limit, the supply is reinstated and the device continues normal operation.

The IDDQ counter state is then compared with an absolute tolerance limit or with a threshold value that is stored during end-of-line IDDQ test. If the absolute limit is exceeded or the counter value deviates by some predetermined amount from the stored threshold value, a reliability warning can be activated and the device serviced or replaced before a real in-use failure. In one embodiment, the reliability warning is an immediate alert that the device needs attention. In another embodiment applicable, for example, to devices in automobiles, the reliability warning is a flag that can be detected during regular maintenance.

The measured time value can be temperature-corrected in one embodiment by an optional on-chip temperature sensor. This enables suppression or cancellation of any applicable reliability warnings if a measurement temperature is above an end-of-line reference measurement.

Figure 3:
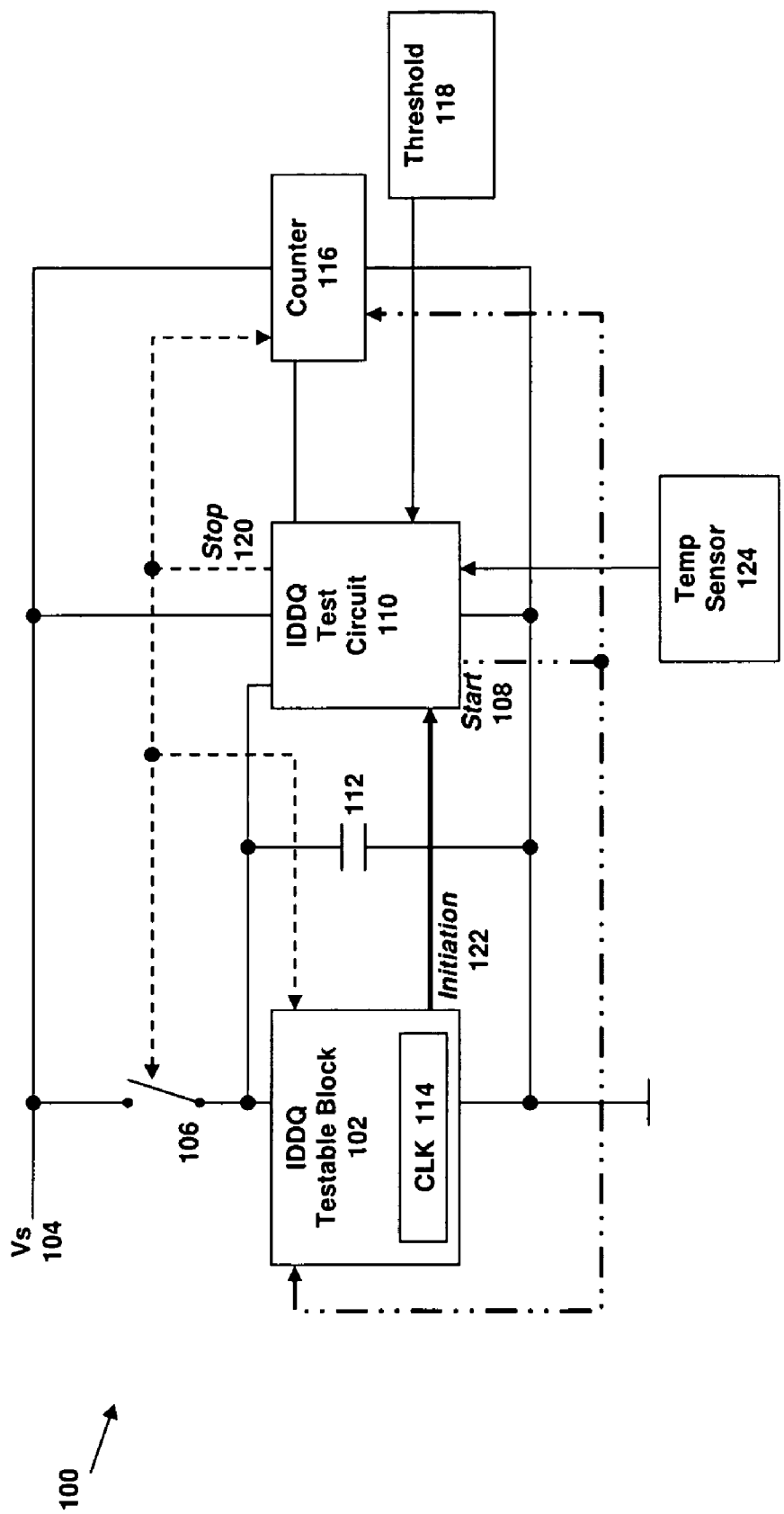
FIG. 3 is a circuit block diagram according to one embodiment.

Accordingly, and referring to FIG. 3, a circuit block diagram 100 according to one embodiment is depicted. An IDDQ testable portion or block 102 of circuit 100 can be disconnected from a supply voltage, Vs 104, by a switch 106, initiated in one embodiment by a start signal 108 (shown in broken line) from an IDDQ test circuit 110. Supply voltage 104 is kept on a buffer capacitor 112, and start signal 108 also turns off a clock 114 of testable block 102. Thus, the only current that is drawn from buffer capacitor 112 is any leakage current of testable block 102.

Start signal 108 also concurrently initiates a discharge time measurement by starting a counter 116. To permit continuation of normal circuit operation after the IDDQ test, the discharge of buffer capacitor 112 is limited to a level that maintains state registers and/or memory within the testable block 102. Counter 116 is stopped if or when buffer capacitor 112 is discharged to a defined level below the normal supply (Vs 104).

The contents of counter 116 are then compared with a threshold 118 which defines a minimum of a tolerable discharge time equivalent to a maximum discharge current. In one embodiment, threshold 118 is determined during end-of-line testing of circuit 102. If the counter 116 result is below threshold 118, the leakage current is too high, and at least a portion of IDDQ testable block 102 could have a reliability risk or other problem. A warning message can be transmitted or a flag set by IDDQ test circuit 110 to trigger maintenance or replacement attention. A more intense response, such as shutting down testable block 102, can be initiated in one embodiment if a portion of testable block 102 is critical to the safety or operation of the overall device of which it comprises a part.

After the test, IDDQ test circuit 110 provides a stop signal 120 (shown in dashed line), closing switch 106 and clearing the contents of counter 116. Circuit 100 then continues normal operation. The IDDQ test routine can be repeated periodically, such as in different states during operation or at different positions in a firmware-defined flow, in order to increase the test coverage.

Embodiments of the IDDQ test routine described herein can cover the entire functional digital part of an IC chip. In one embodiment, the IDDQ test routine can be performed when interruption of normal operation is tolerable, such as in a startup sequence or during idle states of a control state machine. Thus, the IDDQ test routine can be initiated by testable circuit 102 itself via initiation signal 122 according to, for example, an initiation state of a state machine of circuit 102 or by an initiation command in the firmware of a controller. The IDDQ test routine can also be externally initiated in one embodiment by a bus command from a higher level system.

As described above, threshold 118, which defines a minimum of a tolerable discharge time equivalent to a maximum discharge current, is what the contents of counter 116 are compared with. The IDDQ current typically has a spread over fabrication, and threshold 118 is determined during end-of-line testing of circuit 102 in one embodiment. Thus, in one embodiment, threshold 118 is fixed. In order to make the IDDQ test routine sensitive to degradation during operation in the field, however, threshold 118 can also be calculated from the end-of-line measurement and stored individually for each device, e.g. in an EEPROM.

Further, IDDQ current typically shows significant temperature dependence. Thus, the actual temperature can also be measured during the end-of-line IDDQ test by a temperature sensor 124 and threshold 118 can be temperature-corrected in one embodiment. In another embodiment, the IDDQ test routine can be limited to a temperature range which is similar to the conditions that existed when threshold 118 was determined.

Figure 4:
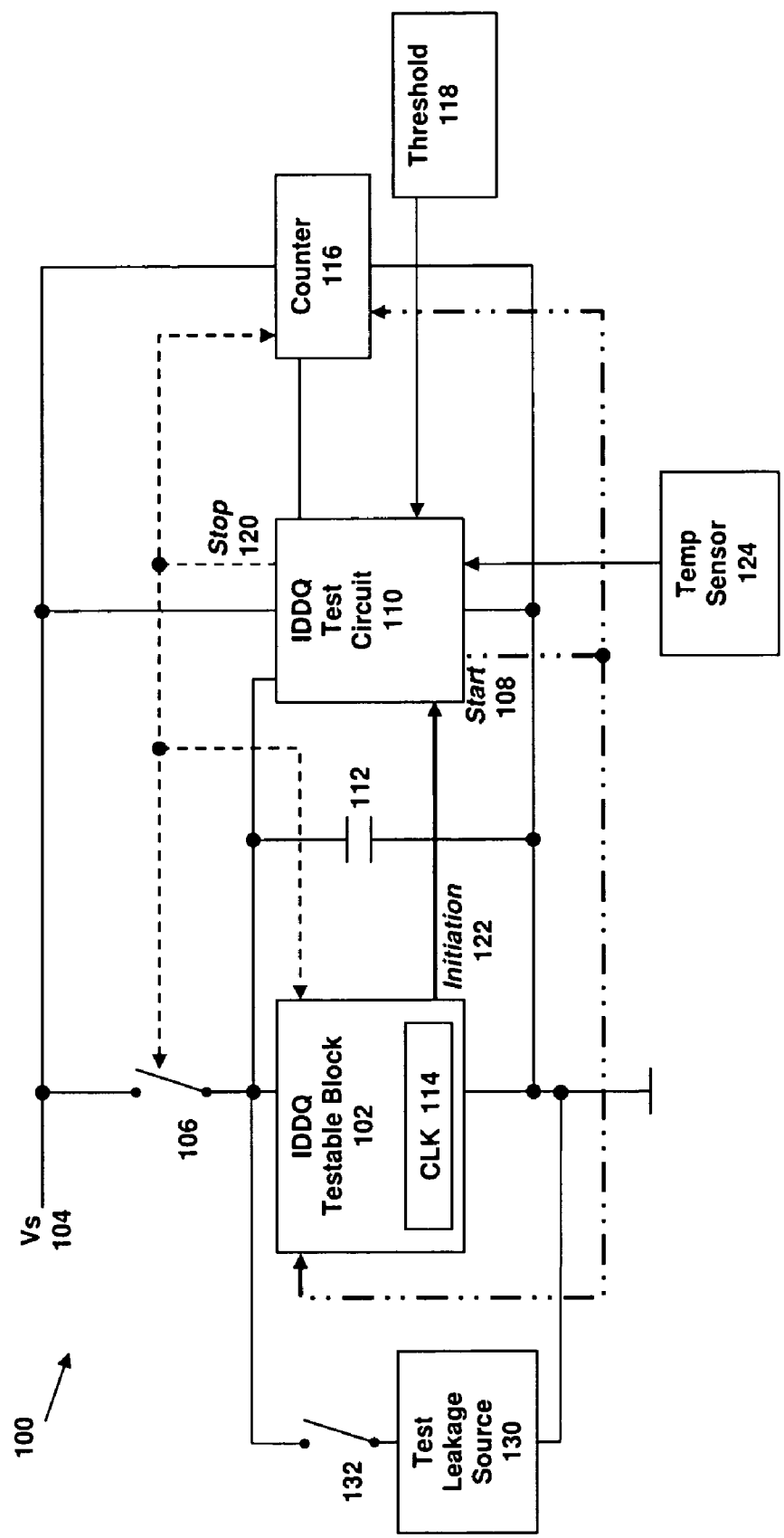
FIG. 4 is a circuit block diagram according to one embodiment.

Additionally, embodiments of the invention can improve the safety integrity level (SIL) of systems and devices by evaluating the integrity of the IDDQ test circuit and procedures. In other words, embodiments of the invention incorporate a "test of the test," a test procedure to evaluate the IDDQ test circuit and methodologies. Referring to FIG. 4, circuit block diagram 100 comprises a test leakage source portion 130 and a switch 132. In use, and before the IDDQ test routine in one embodiment, switch 132 is activated. This activation can be controlled by an external source or internally, such as by a supervisory circuit, a microcontroller, a higher-level state machine, or some other source. In one embodiment, switch 132 can be controlled by an element of IDDQ testable block 102. An embodiment of the IDDQ test as described herein above can then be implemented, during which test leakage source portion 130 is operable to emulate errors in IDDQ test circuit 110 or the test routine implemented by IDDQ test circuit 110. When the IDDQ test routine is complete, switch 106 is closed, switch 132 is opened, and normal operation is restored. Test leakage source portion 130 can be evaluated and an alert or other notification provided in one embodiment if the emulated error was not detected. The alert or other notification can be similar to as described above with respect to errors or problems detected in IDDQ testable block 102 or can be of some other form. If an emulated error was detected, proper operation of IDDQ test circuit 102 can be assumed.

Embodiments of the invention related to IDDQ test circuits and methodologies can therefore detect premature aging, previously undetected manufacturing defects, and other reliability and operational life-reducing problems. Circuits and methodologies according to embodiments of the invention can therefore be useful in safety critical environments, such as automobiles sensors that control airbag, antilock braking, tire pressure and other passenger occupant and vehicular safety systems. Further, embodiments incorporating "test of test" features can improve the SIL of systems and devices implementing the IDDQ test circuits and methodologies.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those skilled in the art will readily appreciate that the invention may be implemented in a very wide variety of embodiments. This application is intended to cover any adaptations or variations of the various embodiments discussed herein, including the disclosure information in the attached appendices. Therefore, it is manifestly intended that this invention be limited only by the claims and the equivalents thereof.

The invention claimed is:

1. A method of testing an integrated circuit in the field comprising:
    forming a quiescent supply current (IDDQ) test circuit;
    coupling the IDDQ test circuit to a testable portion of the integrated circuit;
    scheduling the IDDQ test circuit to test the testable portion of the integrated circuit by selectively interrupting normal operation of the integrated circuit in the field; and
    testing the testable portion of the integrated circuit by the IDDQ test circuit after selectively interrupting normal operation of the integrated circuit in the field by turning off a clock of the testable portion of the integrated circuit, disconnecting the testable portion of the integrated circuit from a supply voltage, measuring a discharge time of a buffer capacitor, and comparing the discharge time of the buffer capacitor with a threshold that was determined from a measurement of the testable portion of the integrated circuit during manufacturing of the integrated circuit and stored individually for the integrated circuit.

2. The method of claim 1, further comprising:
    providing an indication if the discharge time is below the threshold.

3. The method of claim 1, further comprising:
    activating a test of the IDDQ test circuit.

4. The method of claim 3, further comprising evaluating an integrity of the IDDQ test circuit by:
    activating a test leakage source;

emulating an error by the test leakage source during the testing of the testable portion of the integrated circuit; and determining whether the emulated error was detected.

5. The method of claim 1, further comprising:

compensating the threshold according to a sensed temperature.

6. The method of claim 1, wherein scheduling comprises programming software to execute the testing of the integrated circuit in the field.

7. The method of claim 1, wherein scheduling comprises hardwiring a state machine to execute the testing of the integrated circuit in the field.

8. The method of claim 1, further comprising storing the threshold in an EEPROM of the integrated circuit.

9. The method of claim 1, further comprising correcting the threshold value according to a temperature sensed by a temperature sensor coupled to the IDDQ test circuit.

* * * * *